US012563834B2

(12) United States Patent
Zhang

(10) Patent No.: US 12,563,834 B2
(45) Date of Patent: Feb. 24, 2026

(54) DISPLAY PANEL HAVING CONDUCTIVE OXIDE ON SOURCE AND DRAIN ELECTRODES OF THIN-FILM TRANSISTOR

(71) Applicant: GUANGZHOU CHINA STAR OPTOELECTRONICS SEMICONDUCTOR DISPLAY TECHNOLOGY CO., LTD., Guangdong (CN)

(72) Inventor: Yi Zhang, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 783 days.

(21) Appl. No.: 17/758,227

(22) PCT Filed: Jun. 10, 2022

(86) PCT No.: PCT/CN2022/098243
§ 371 (c)(1),
(2) Date: Jun. 30, 2022

(87) PCT Pub. No.: WO2023/221209
PCT Pub. Date: Nov. 23, 2023

(65) Prior Publication Data
US 2024/0204001 A1 Jun. 20, 2024

(30) Foreign Application Priority Data

May 17, 2022 (CN) .......................... 202210537930.5

(51) Int. Cl.
H10D 86/60 (2025.01)
H10D 30/67 (2025.01)
(Continued)

(52) U.S. Cl.
CPC ......... H10D 86/60 (2025.01); H10D 30/6755 (2025.01); H10D 86/0231 (2025.01); H10D 86/423 (2025.01); H10D 86/451 (2025.01)

(58) Field of Classification Search
CPC ........... H10D 30/6755; H10D 30/6756; H10D 30/0316
See application file for complete search history.

(56) References Cited

U.S. PATENT DOCUMENTS 6,232,158 B1    5/2001  Lee
7,211,825 B2 *  5/2007  Shih ................... H10D 30/6734
                                                           257/66
(Continued)

FOREIGN PATENT DOCUMENTS

CN        102854685 A      1/2013
CN        105448823 A      3/2016
(Continued)

OTHER PUBLICATIONS

International Search Report in International application No. PCT/CN2022/098243,mailed on Dec. 21, 2022.
(Continued)

*Primary Examiner* — Kevin Parendo
(74) *Attorney, Agent, or Firm* — PV IP PC; Christopher S. Ruprecht; Wei Te Chung

(57) ABSTRACT

A display panel and a manufacturing method thereof are provided. The display panel includes a first metal layer, a first insulating layer, and an oxide layer. The first metal layer includes a gate electrode, a source electrode, and a drain electrode disposed in a same layer. The first insulating layer has openings exposing the source electrode and the drain electrode. The oxide layer is positioned on the first insulating layer and in the opening. The oxide layer includes a channel layer positioned above the gate electrode, a first conductor layer connected to the source electrode and the
(Continued)

channel layer, a second conductor layer connected to the drain electrode and the channel layer, and a pixel electrode connected to the drain electrode.

8 Claims, 5 Drawing Sheets

(51) Int. Cl.
    H10D 86/01          (2025.01)
    H10D 86/40          (2025.01)

(56)           References Cited

U.S. PATENT DOCUMENTS

| | | | |
|---|---|---|---|
| 2005/0275038 A1* | 12/2005 | Shih | H10D 30/6755 |
| | | | 257/382 |
| 2013/0171836 A1* | 7/2013 | Liu | H01L 21/443 |
| | | | 438/768 |

| | | | |
|---|---|---|---|
| 2015/0187953 A1 | 7/2015 | Koezuka et al. | |
| 2018/0308958 A1 | 10/2018 | Shu et al. | |
| 2020/0075773 A1* | 3/2020 | Zhang | H10D 86/60 |

FOREIGN PATENT DOCUMENTS

| | | |
|---|---|---|
| CN | 105514034 A | 4/2016 |
| CN | 105655291 A | 6/2016 |
| CN | 109192661 A | 1/2019 |
| CN | 109585298 A | 4/2019 |
| CN | 110993612 A | 4/2020 |
| CN | 111129084 A | 5/2020 |

OTHER PUBLICATIONS

Written Opinion of the International Search Authority in International application No. PCT/CN2022/098243,mailed on Dec. 22, 2022.
Chinese Office Action issued in corresponding Chinese Patent Application No. 202210537930.5 dated Jul. 28, 2025, pp. 1-8.

* cited by examiner

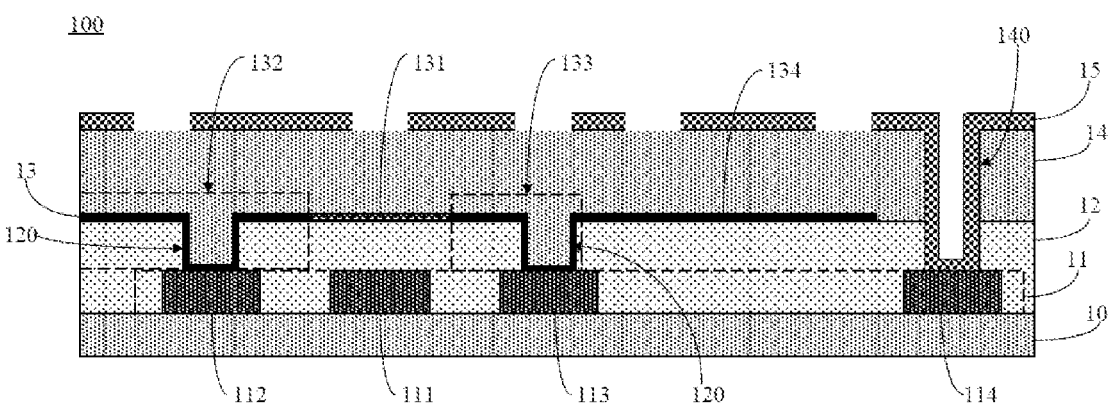

FIG. 1

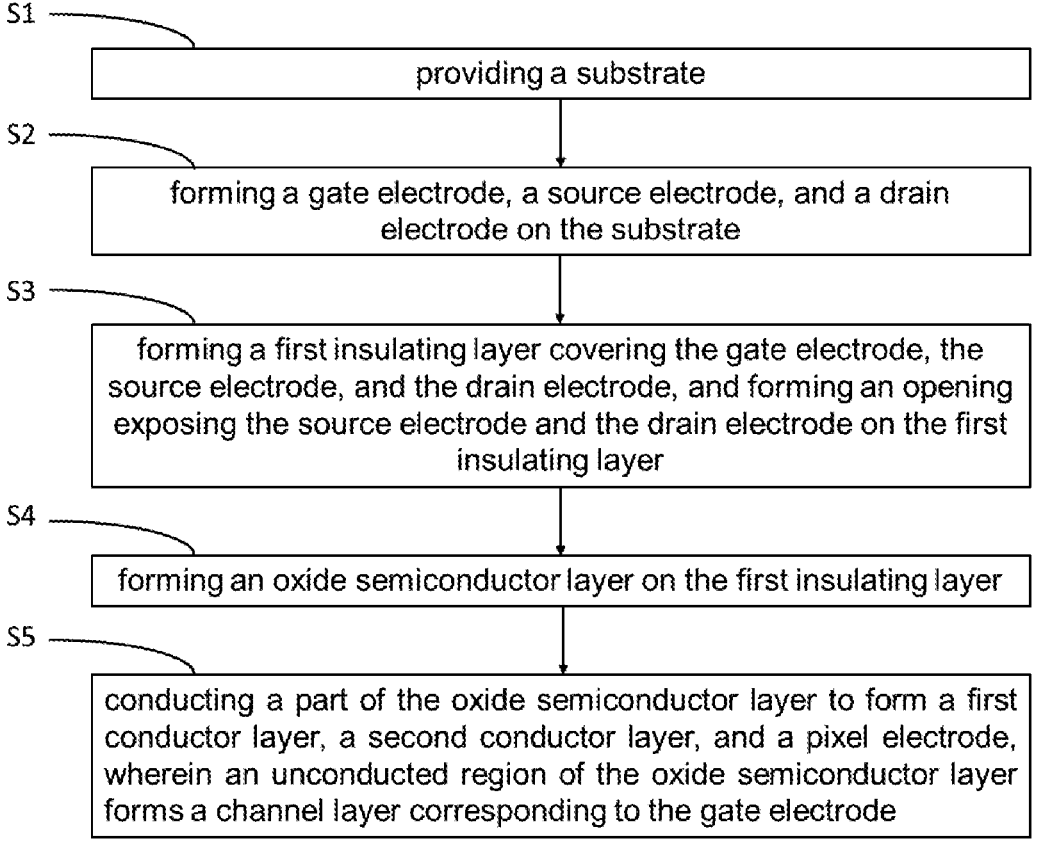

S1 — providing a substrate

S2 — forming a gate electrode, a source electrode, and a drain electrode on the substrate S3 — forming a first insulating layer covering the gate electrode, the source electrode, and the drain electrode, and forming an opening exposing the source electrode and the drain electrode on the first insulating layer S4 — forming an oxide semiconductor layer on the first insulating layer S5 — conducting a part of the oxide semiconductor layer to form a first conductor layer, a second conductor layer, and a pixel electrode, wherein an unconducted region of the oxide semiconductor layer forms a channel layer corresponding to the gate electrode

FIG. 2

DISPLAY PANEL HAVING CONDUCTIVE OXIDE ON SOURCE AND DRAIN ELECTRODES OF THIN-FILM TRANSISTOR

FIELD OF INVENTION

The present application relates to a field of display technology, and in particular, to a display panel and a manufacturing method thereof.

BACKGROUND OF INVENTION

Oxide semiconductors have high mobility and can replace amorphous silicon (a-Si) for manufacturing high-performance (such as high refresh rate and high resolution) liquid crystal display (LCD) panels. Low temperature poly-silicon (LTPS) display panels have significant cost advantages and are therefore widely used.

However, compared to amorphous silicon (a-Si) backplates, a fabrication of oxide backplates requires more masks, therefore a cost of the oxide backplate is significantly higher than a cost of the a-Si backplate. Especially in a high transmission fringe field switching (HFS) display mode, an array substrate of a-Si backplate generally uses 4 to 6 masks, while an array substrate of the oxide backplate requires 6 to 9 masks, adding masks result in a huge loss of productivity and a significant increase in cost.

Therefore, reducing a number of masks of oxide HFS products is very important to promote applications of oxide products and expand a market advantage of oxide products.

SUMMARY OF INVENTION

A purpose of the present application is to provide a display panel and a manufacturing method thereof, aiming at reducing a number of masks required for manufacturing the display panel, thereby reducing the product cost.

In one aspect, the present application provides a display panel, including:

a substrate;

a first metal layer positioned on the substrate, wherein the first metal layer comprises a gate electrode, a source electrode, and a drain electrode disposed in a same layer;

a first insulating layer covering the first metal layer, wherein the first insulating layer comprises openings exposing the source electrode and the drain electrode; and an oxide layer positioned on the first insulating layer and in the openings;

wherein the oxide layer comprises a channel layer, a first conductor layer, a second conductor layer, and a pixel electrode, wherein the channel layer is positioned on the gate electrode, wherein the first conductor layer is connected to the source electrode and the channel layer, wherein the second conductor layer is connected to the drain electrode and the channel layer, and wherein the pixel electrode is connected to the drain electrode.

In some embodiments, the first metal layer further includes:

an applied electrode disposed in a same layer as the gate electrode, the source electrode, and the drain electrode, wherein an orthographic projection of the pixel electrode on the substrate is not overlapped with an orthographic projection of the applied electrode on the substrate.

In some embodiments, the display panel further includes:

a second insulating layer covering the oxide layer and the first insulating layer, wherein a through hole exposing the applied electrode is formed in the first insulating layer and the second insulating layer; and a common electrode positioned on the second insulating layer and in the through hole, wherein the common electrode is connected to the applied electrode.

In some embodiments, the gate electrode is positioned between the source electrode and the drain electrode.

On the other hand, the present application provides a method of manufacturing a display panel, including providing a substrate;

forming a gate electrode, a source electrode, and a drain electrode on the substrate;

forming a first insulating layer covering the gate electrode, the source electrode, and the drain electrode, and forming openings exposing the source electrode and the drain electrode on the first insulating layer;

forming an oxide semiconductor layer on the first insulating layer; and conducting a part of the oxide semiconductor layer to form a first conductor layer, a second conductor layer, and a pixel electrode, wherein an unconducted region of the oxide semiconductor layer forms a channel layer corresponding to the gate electrode.

In some embodiments, the step of forming the gate electrode, the source electrode, and the drain electrode on the substrate includes:

depositing a metal layer on the substrate; and etching the metal layer with a mask to form the gate electrode, the source electrode, and the drain electrode.

In some embodiments, the method further including forming an applied electrode when the metal layer is etched with a mask, wherein the applied electrode is positioned outside of the source electrode and the drain electrode.

In some embodiments, after the step of forming the oxide semiconductor layer on the first insulating layer, the method further includes:

forming a first photoresist layer on the first insulating layer and in the openings;

photolithographing the first photoresist layer by using a halftone mask, and removing the first photoresist layer above the applied electrode to form a second photoresist layer; and removing the oxide semiconductor layer not covered by the second photoresist layer by etching.

In some embodiments, the second photoresist layer includes a first photoresist portion corresponding to and above the gate electrode, and a second photoresist portion positioned on both sides of the first photoresist portion, wherein a thickness of the first photoresist portion is greater than a thickness of the second photoresist portion, and wherein after the step of removing the oxide semiconductor layer not covered by the second photoresist layer by etching, the method further includes:

ashing the second photoresist layer by an ashing process to remove the second photoresist portion and thinning the first photoresist portion;

wherein the step of conducting a part of the oxide semiconductor layer includes:

bombarding a portion of the oxide semiconductor layer not covered by the first photoresist portion with oxygen gas or helium gas to form a first conductor layer, a second conductor layer, and a pixel electrode.

In some embodiments, the method further includes:

forming a second insulating layer covering the first insulating layer, and forming a through hole in the second insulating layer and the first insulating layer exposing the applied electrode; and forming a second metal layer on the second insulating layer and in the through hole, and patterning the second metal layer to form a common electrode connected to the applied electrode.

The present application provides a display panel and a manufacturing method thereof. The display panel includes a substrate, a first metal layer positioned on the substrate, a first insulating layer covering the first metal layer, and an oxide layer. The first metal layer includes a gate electrode, a source electrode, and a drain electrode arranged in a same layer. The first insulating layer includes openings exposing the source electrode and the drain electrode. The oxide layer is positioned on the first insulating layer and in the openings. The oxide layer includes a channel layer positioned the gate electrode, a first conductor layer connecting the source electrode and the channel layer, a second conductor layer connecting the drain electrode and the channel layer, and a pixel electrode connected to the drain electrode. Since the gate electrode, the source electrode, and the drain electrode are arranged in a same layer, the gate electrode, source electrode, and the drain electrode can be manufactured with one mask. Since the oxide layer includes the channel layer, the first conductor layer, the second conductor layer, and the pixel electrode, a separate photomask is not required to manufacture the pixel electrode, therefore a number of photomasks can be greatly reduced, thereby reducing product cost.

DESCRIPTION OF FIGURES

The technical solutions and other beneficial effects of the present application will be apparent through the detailed description of the specific embodiments of the present application in conjunction with the accompanying figures.

FIG. 1 is a schematic structural diagram of a display panel provided by one embodiment of the present application.

FIG. 2 is a schematic flowchart of a method of manufacturing the display panel provided by one embodiment of the present application.

DETAILED DESCRIPTION OF EMBODIMENTS

Figure 3A:
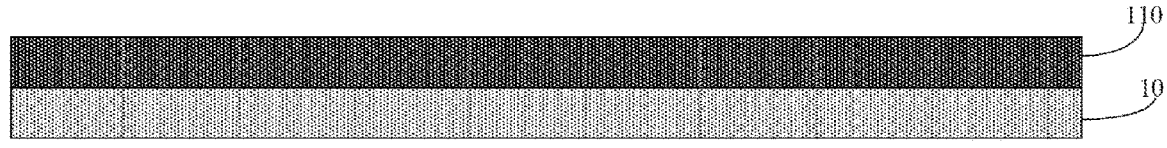
FIGS. 3a to 3m are schematic structural diagrams of a method of manufacturing the display panel provided in one embodiment of the present application.

The technical solutions in the embodiments of the present application will be clearly and completely described below with reference to the accompanying figures in the embodiments of the present application. Obviously, the described embodiments are only a part of the embodiments of the present application, but not all of the embodiments. Based on the embodiments in the present application, all other embodiments obtained by those skilled in the art without inventive steps shall fall within a protection scope of the present application.

In the description of the present application, it should be understood that the terms "first" and "second" are only used for description purposes, and cannot be interpreted as indicating or implying relative importance or implicitly indicating the number of indicated technical features. Thus, features defined as "first", "second" may expressly or implicitly include one or more of the features. In the description of the present application, "plurality" means two or more, unless otherwise expressly and specifically defined.

In the present application, unless otherwise expressly specified and defined, a first feature "on" or "under" a second feature may include direct contact between the first feature and the second feature, or may include the first and second features not directly contact but through additional features contact between them. Also, the first feature being "above", "over" and "upon" the second feature includes the first feature being directly above and obliquely above the second feature, or simply means that the first feature is level higher than the second feature. The first feature is "low", "below" and "down" the second feature includes the first feature being directly below and diagonally below the second feature, or simply means that the first feature has a lower level than the second feature.

The following disclosure provides many different embodiments or examples for implementing different structures of the present application. To simplify the disclosure of the present application, the components and arrangements of specific examples are described below. Of course, they are only examples and are not intended to limit the present application. Furthermore, the present application may repeat reference numerals and/or reference letters in different instances for a purpose of simplicity and clarity, and itself does not indicate a relationship between the various embodiments and/or arrangements discussed. In addition, the present application provides examples of various specific processes and materials, but one of ordinary skill in the art will recognize the applications of other processes and/or the use of other materials.

Please refer to FIG. 1, FIG. 1 is a schematic structural diagram of a display panel provided by one embodiment of the present application.

The display panel 100 includes a substrate 10, a first metal layer 11 on the substrate 10, a first insulating layer 12 covering the first metal layer 11, and an oxide layer 13. The first metal layer 11 includes a gate electrode 111, a source electrode 112, and a drain electrode 113 disposed on a same layer, that is, the gate electrode 111, the source electrode 112, and the drain electrode 113 are all positioned on the substrate 10. The first insulating layer 12 has openings 120 exposing the source electrode 112 and the drain electrode 113. The oxide layer 13 is positioned on the first insulating layer 12 and in the openings 120. The oxide layer 13 includes a channel layer 131 corresponding to and on the gate electrode 111, a first conductor layer 132 connected to the source electrode 112 and the channel layer 131, a second conductor layer 133 connected to the drain electrode 113 and the channel layer 131, and a pixel electrode 134 connected to the drain electrode 113 through the second conductor layer 133.

The substrate 10 includes one or a combination of a glass substrate and a flexible substrate. A material of the first metal layer 11 may be Mo, Mo/Al, Mo/Cu, Mo/Cu/IZO, IZO/Cu/IZO, Mo/Cu/ITO, Ni/Cu/Ni, MoTiNi/Cu/MoTiNi, NiCr/Cu/NiCr or CuNb etc. A material of the first insulating layer 12 may be SiOx, SiNx, Al2O3/SiNx/SiOx, SiOx/SiNx/SiOx, and the like. A material of the oxide layer 13 includes a semiconductor oxide, such as indium gallium zinc oxide (IGZO).

It should be noted that the materials of the channel layer 131, the first conductor layer 132, the second conductor layer 133, and the pixel electrode 134 can include IGZO, but the channel layer 131 is untreated IGZO (belongs to semiconductor). The first conductor layer 132, the second conductor layer 133, and the pixel electrode 134 are made of conductive IGZO. A difference between conductive IGZO and untreated semiconductor IGZO is that conductive IGZO has lower resistivity and is used for electrical connection, while semiconductor IGZO is used to form a channel region. In terms of microstructure, the conductive IGZO has a higher oxygen vacancy rate than the semiconductor IGZO, so the conductivity is better.

In this embodiment, the first conductor layer 132 is used to electrically connect or bridge the channel layer 131 and the source electrode 112. The second conductor layer 133 is used to electrically connect or bridge the channel layer 131 and the drain electrode 113, and is also used to electrically connect the drain electrode 113 and the pixel electrode 134.

In one embodiment, the gate electrode 111 is positioned between the source electrode 112 and the drain electrode 113, and the channel layer 131 corresponds to a top of the gate electrode 111. The first conductor layer 132 and the second conductor layer 133 are respectively connected to both terminals of the channel layer 131. It can also be said that the channel layer 131 is positioned between the first conductor layer 132 and the second conductor layer 133. Therefore, the channel layer 131 can be conducted when a certain voltage is applied to the gate electrode 111, thereby turning on the source electrode 112 and the drain electrode 113.

In this embodiment, the pixel electrode 134 and the drain electrode 113 are connected through the second conductor layer 133, so a voltage output from the drain electrode 113 can drive the pixel electrode 134 to realize pixel driving. Since the second conductor layer 133 is also connected to the channel layer 131, both terminals of the first conductor layer 132 are respectively connected to the channel layer 131 and the pixel electrode 134.

In some embodiments, the first metal layer 11 further includes an applied electrode 114. The applied electrode 114 is positioned on the substrate 10 and is provided in a same layer as the gate electrode 111, the source electrode 112, and the drain electrode 113. The applied electrode 114 is not covered by the oxide layer 13. That is, a top of the applied electrode 114 is not blocked by the oxide layer 13. It can also be said that an orthographic projection of the pixel electrode 134 on the substrate 10 is not overlapped an orthographic projection of the applied electrode 114 on the substrate. The applied electrode 114 is disposed adjacent to the drain electrode 113, that is, the drain electrode 113 is positioned between the gate electrode 111 and the applied electrode 114. In one embodiment, the applied electrode 114 may also be disposed adjacent to the source electrode 112, that is, the source electrode 112 is positioned between the gate electrode 111 and the applied electrode 114.

In some embodiments, the display panel 100 further include a second insulating layer 14 covering the oxide layer 13 and the first insulating layer 12. Specifically, the second insulating layer 14 covers the oxide layer 13 and a surface of the first insulating layer 12 that is not covered by the oxide layer 13. Therefore, the second insulating layer 14 is positioned at a position corresponding to the top of the applied electrode 114 on the insulating layer 12. Moreover, at a position above the corresponding applied electrodes 114, a through hole 140 exposing the applied electrode 114 is formed in the first insulating layer 12 and the second insulating layer 14. A material of the second insulating layer 14 may be SiOx, SiNx, Al2O3/SiNx/SiOx, SiOx/SiNx/ SiOx, and the like.

In some embodiments, the display panel 100 further includes a common electrode 15 positioned on the second insulating layer 14 and in the through hole 140, the common electrode 15 is connected to the applied electrode 114 through the through hole 140. In this way, a voltage signal can be applied to the common electrode 15 through the applied electrode 114. On the other hand, under high frequency signals, a resistance of the common electrode 15 is not uniform. By setting the applied electrode 114 connected to the common electrode 15, a resistance of the in-plane common electrode 15 can be reduced. The common electrode 15 is be a strip electrode.

In the display panel 100 provided by the embodiment of the present application, the gate electrode 111, the source electrode 112, and the drain electrode 113 are disposed in a same layer on the substrate 10. Therefore, the gate electrode 111, the source electrode 112, and the drain electrode 113 can be formed by using one mask. Moreover, the channel layer 131 and the pixel electrode 134 can be formed only by using one mask to manufacture the oxide layer 13, and no separate mask is needed to manufacture the pixel electrode 134, so a number of masks can be greatly reduced, thereby reducing the product cost and increasing productivity. In addition, the gate electrode 111 does not overlap with the source electrode 112 and the drain electrode 113, so that a parasitic capacitance (Cgs) between the gate electrode 111 and the source electrode 112 and a parasitic capacitance (Cgd) between the gate electrode 111 and the drain electrode 113 can be greatly reduced, thereby a LC loading can be reduced and a charging rate can be improved, so the product quality can be improved.

Please refer to FIG. 2, which is a schematic flowchart of a method of manufacturing the display panel provided by one embodiment of the present application. Please refer to FIGS. 3a to 3m at the same time. FIGS. 3a to 3m are schematic structural diagrams of the display panel provided in the embodiment of the present application in the manufacturing process. The manufacturing method can be used to manufacture the display panel 100 provided in the above-mentioned embodiment, and the manufacturing method of the display panel includes the following steps S1 to S4.

Figure 3B:
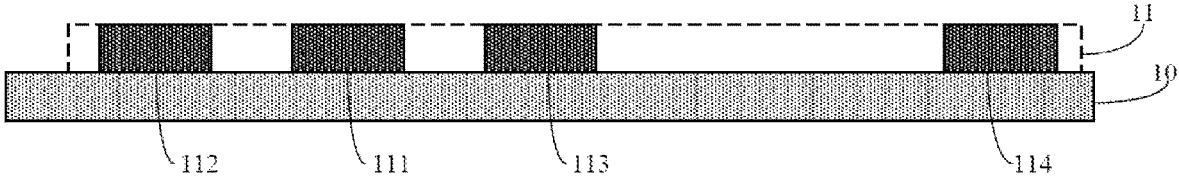

Please refer to steps S1 to S2 of FIG. 2 and FIGS. 3a to 3b.

Step S1: providing a substrate 10.

The substrate 10 include one or a combination of a glass substrate and a flexible substrate.

Step S2: forming a gate electrode 111, a source electrode 112, and a drain electrode 113 on the substrate 10.

As shown in FIG. 3a, a metal layer 110 is first formed on the substrate 10 by a deposition process (eg, physical vapor deposition (PVD)). As shown in FIG. 3b, the metal layer 110 is then etched with a mask to form the first metal layer 11, wherein the first metal layer 11 includes a gate electrode 111, a source electrode 112, a drain electrode 113 and an applied electrode 114. The applied electrode 114 is positioned outside the source electrode 112 and the drain electrode 113. Specifically, a photoresist layer is first formed on the metal layer 110, then a mask is used to pattern the photoresist layer, and then the metal layer 110 is etched by using the patterned photoresist layer. From left to right in FIG. 3b are the source electrode 112, the gate electrode 111, the drain electrode 113, and the applied electrode 114. That is, the gate electrode 111 is positioned between the source electrode 112 and the drain electrode 113, and the drain electrode 113 is positioned between the gate electrode 111 and the applied electrode 114.

Figure 3C:
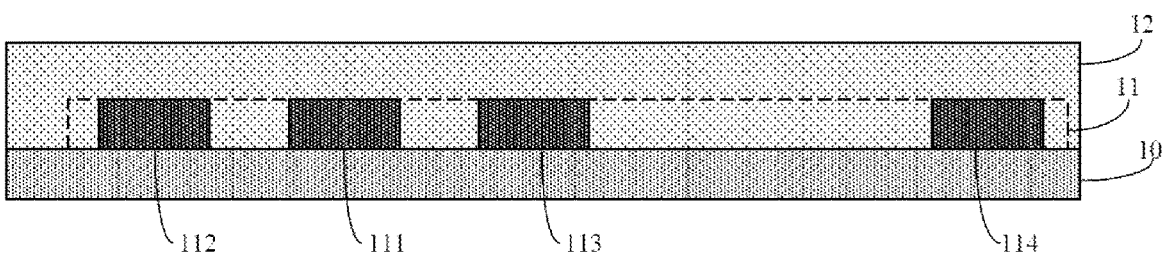
Figure 3D:
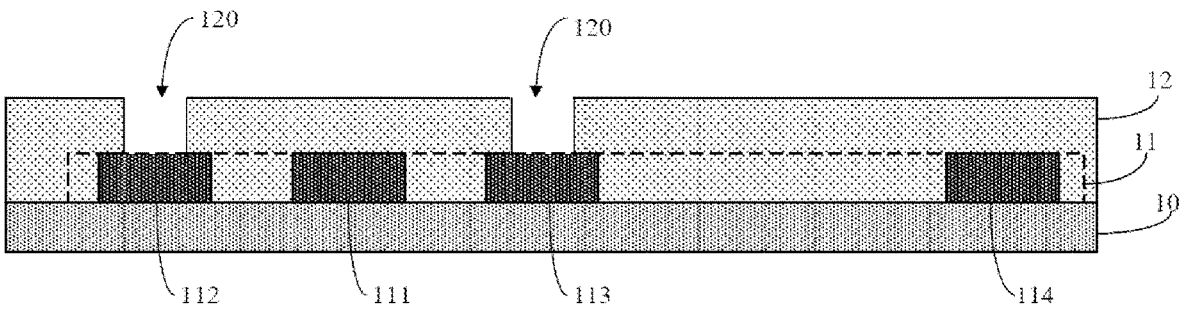

Please refer to step S3 in FIG. 2 and FIGS. 3c to 3d.

Step S3: forming a first insulating layer 12 covering the gate electrode 111, the source electrode 112, and the drain electrode 113, and forming openings 120 on the first insulating layer 12 exposing the source electrode 112 and the drain electrode 113.

As shown in FIG. 3*c*, a first insulating layer 12 is first formed on the substrate 10 and the first metal layer 11 by a deposition process (eg, chemical vapor deposition (CVD)). As shown in FIG. 3*d*, an etching process is performed on the first insulating layer 12 by using a photomask to form openings 120 exposing the source electrode 112 and the drain electrode 113.

Figure 3E:
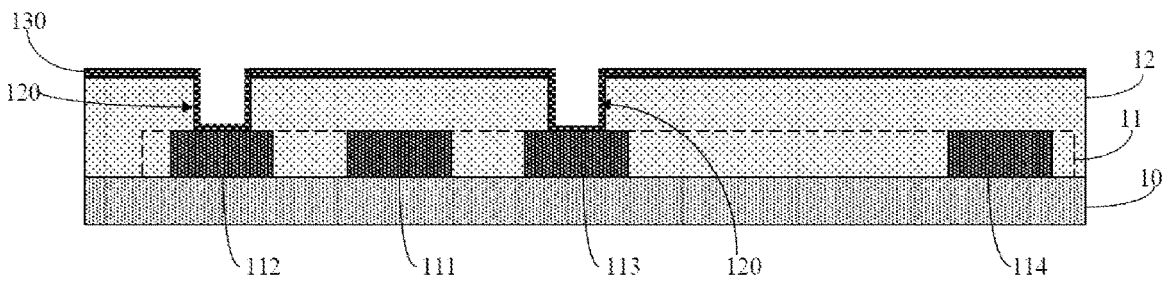

Please refer to step S4 in FIG. 2 and FIG. 3*e*.

Step S4: forming the oxide semiconductor layer 130 on the first insulating layer 12.

As shown in FIG. 3*e*, an oxide semiconductor layer 130 is deposited on the first insulating layer 12 and in the openings 120.

Figure 3F:
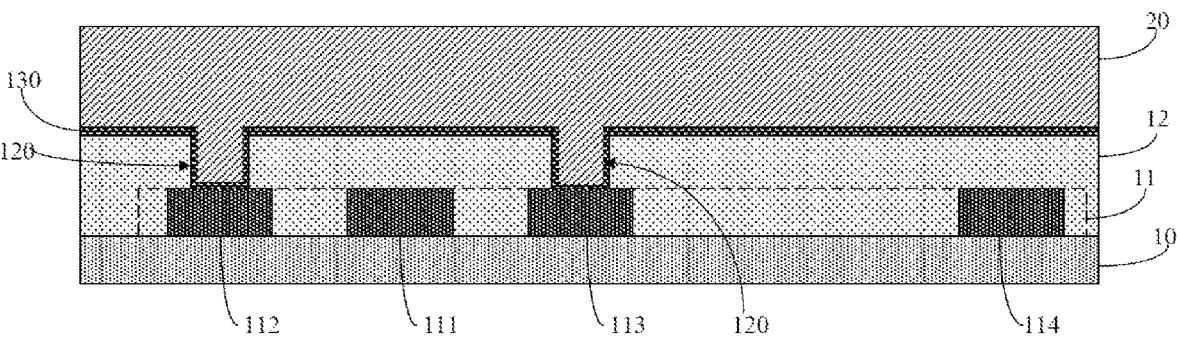
Figure 3G:
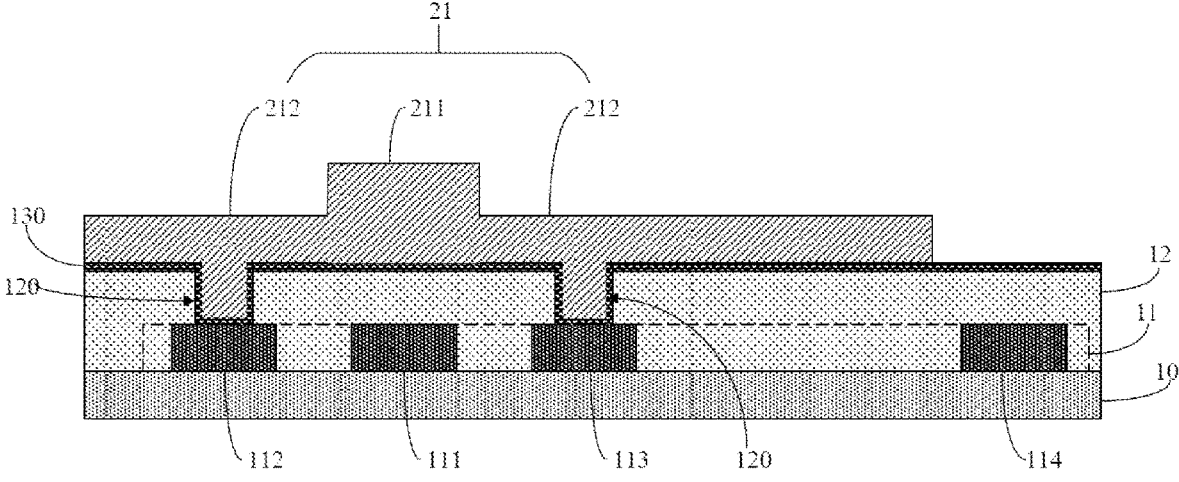
Figure 3H:
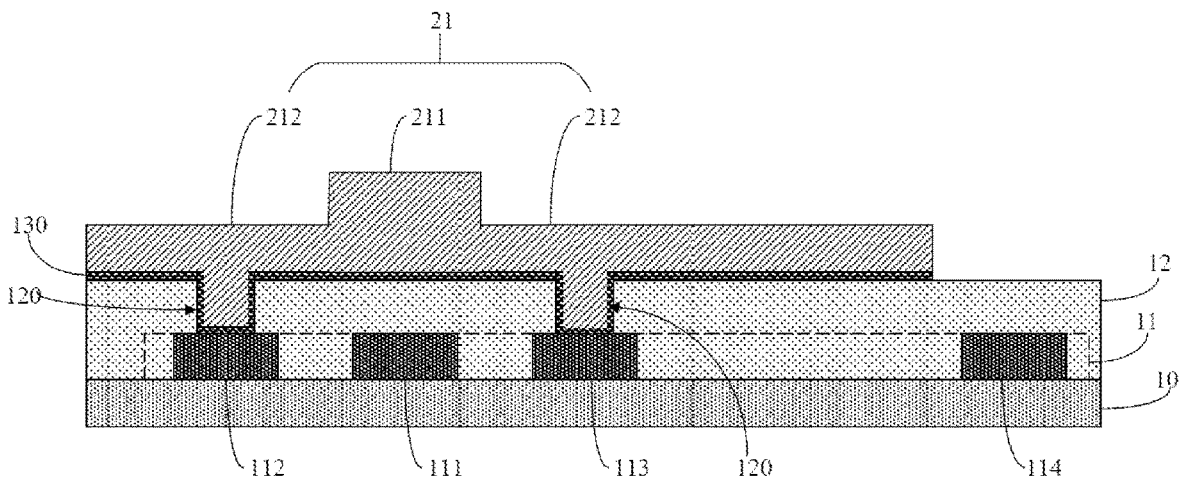
Figure 3I:
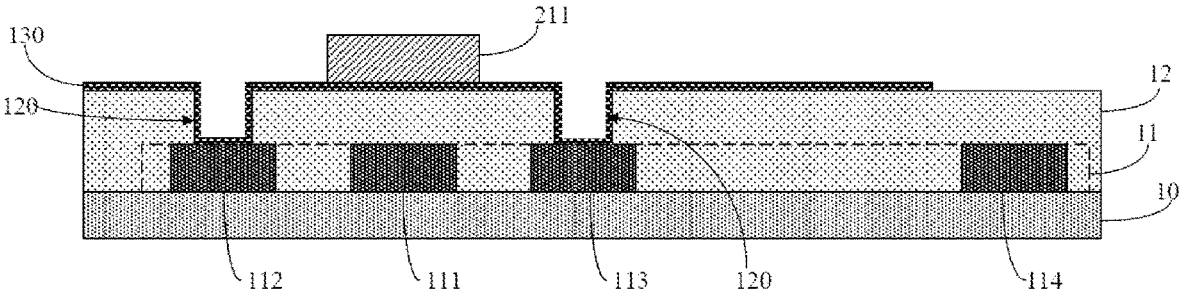

Please refer to FIGS. 3*f* to 3*i*, after step S4, the manufacturing method further includes the following steps. 1) As shown in FIG. 3*f*, a first photoresist layer 20 is formed on the oxide semiconductor layer 130 (or on the first insulating layer 12 and in the openings 120). 2) As shown in FIG. 3*g*, a photolithography process is performed by a half tone mask (HTM) on the first photoresist layer 20 to remove the first photoresist layer 20 corresponding to the applied electrode 114 to form the second photoresist layer 21. 3) As shown in FIG. 3*h*, an etching process is performed on the oxide semiconductor layer 130 to remove the oxide semiconductor layer 130 (or the oxide semiconductor layer 130 not covered by the second photoresist layer 21) corresponding to the applied electrode 114. 4) As shown in FIG. 3*i*, an ashing process is performed on the second photoresist layer 21 to remove the second photoresist portion 212 and thin the first photoresist portion 211, so that only a portion of the first photoresist portion 211 above the gate electrode 111 is remained. After that, the following step S5 is performed.

In this embodiment, the second photoresist layer 21 includes a first photoresist portion 211 corresponding to a top of the gate electrode 111 and a second photoresist portion 212 positioned on both terminals of the first photoresist portion 211. A thickness of the first photoresist portion 211 is greater than a thickness of the second photoresist portion 212. In one embodiment, a region of a halftone reticle corresponding to a top of the applied electrode 114 is a light-transmitting region, a region corresponding to the second photoresist portion 212 is a semi-light-transmitting region, and a region of the halftone reticle corresponding to the first photoresist portion 211 is a non-light-transmitting region.

Figure 3J:
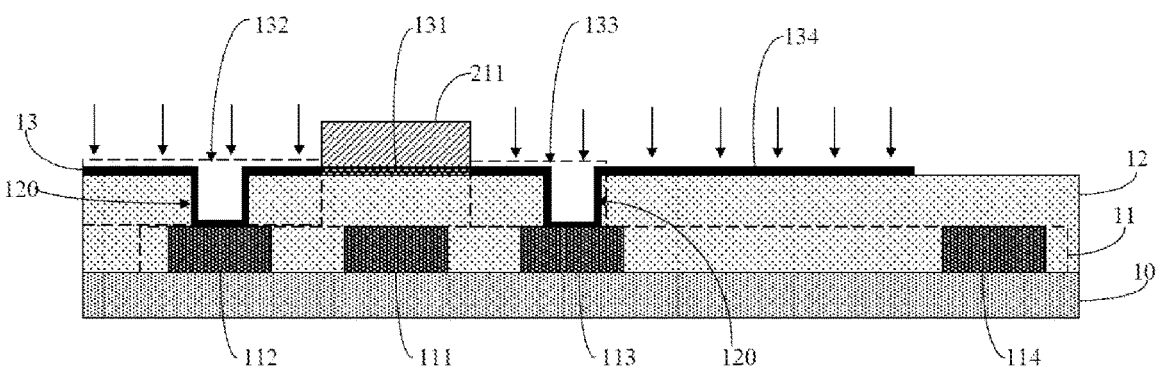
Figure 3K:
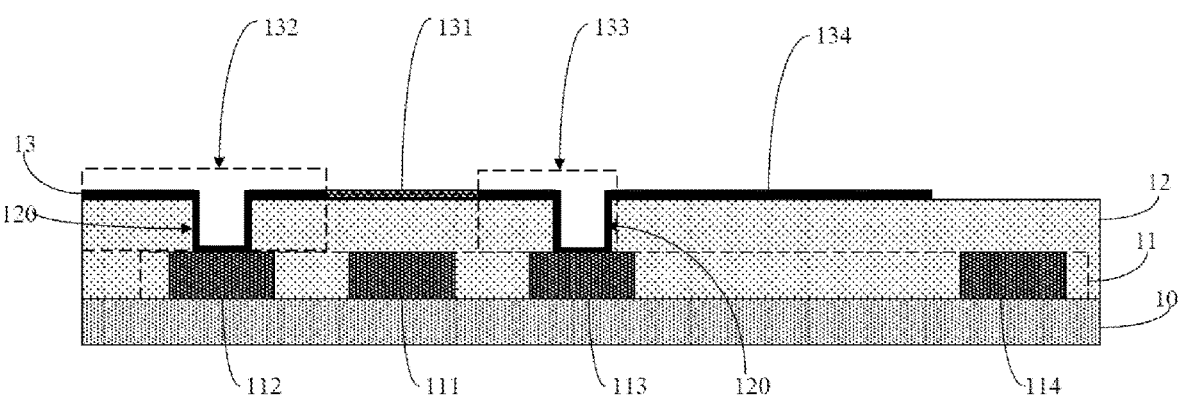

Please refer to step S5 in FIG. 2 and FIGS. 3J to 3*k*.

Step S5: conducting a part of the oxide semiconductor layer 130 to form a first conductor layer 132, a second conductor layer 133, and a pixel electrode 134, wherein an unconducted region of the oxide semiconductor layer forms a channel layer 131 corresponding to the gate electrode 111.

Specifically, 1) As shown in FIG. 3*j*, oxygen or helium is used to bombard the oxide semiconductor layer 130 not covered by the first photoresist portion 211 to increase structural defects, thereby increasing an oxygen vacancy rate, so as to increase an vacancy rate of oxygen and a conductivity. The oxide semiconductor layer 130 under the first photoresist portion 211 is shielded and thus is not conducted to serve as the channel layer 131. The conducted oxide semiconductor layer 130 becomes a conductor and includes the first conductor layer 132, the second conductor layer 133, and the pixel electrode 134. The first conductor layer 132 is connected to the source electrode 112 and the channel layer 131, the second conductor layer 133 is connected to the channel layer 131 and the drain electrode 113, and also is connected to the drain electrode 113 and the pixel electrode 134. 2) As shown in FIG. 3*k*, the remaining first photoresist portion 211 is removed.

Figure 3L:
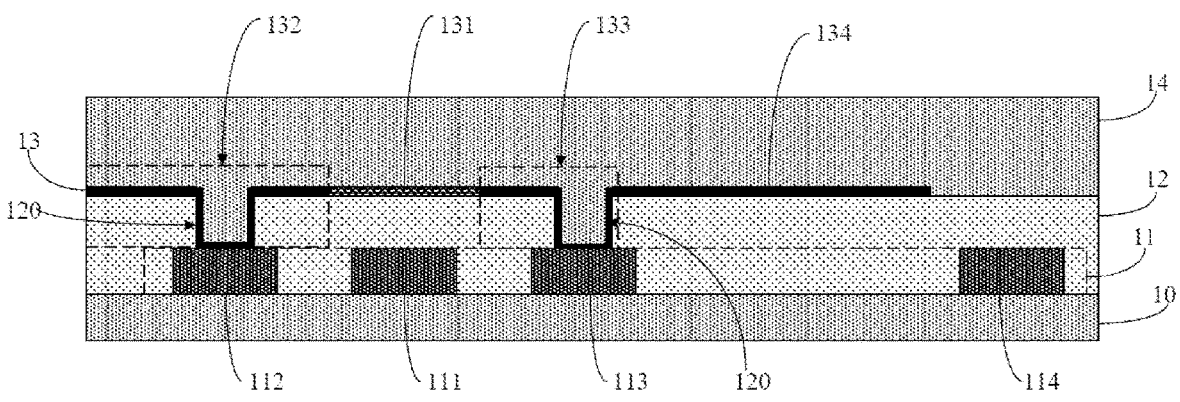
Figure 3M:
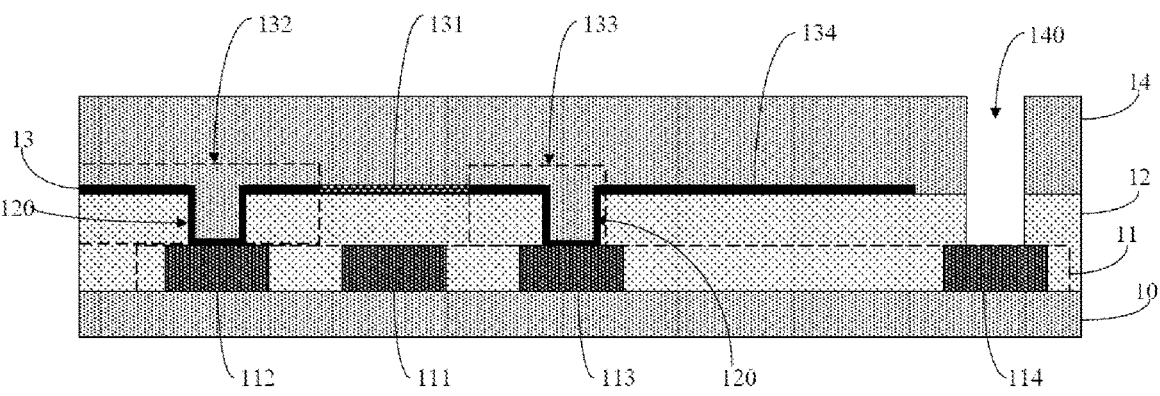

Please refer to FIGS. 3*l* to 3*m* and FIG. 1.

The manufacturing method of the display panel 100 further includes the following steps: 1) as shown in FIG. 3*l* and FIG. 3*m*, forming a second insulating layer 14 covering the oxide layer 13 and the first insulating layer 12, and forming a through hole 140*a* on the applied electrode 114 and in the second insulating layer 14 and the first insulating layer 12; 2) As shown in FIG. 1, a second metal layer is formed on the second insulating layer 14 and in the through hole 140, and then the second metal layer is patterned to form a common electrode 15, wherein the common electrode 15 is connected to the applied electrode 114.

Specifically, the second insulating layer 14 is deposited on the channel layer 131, the first conductor layer 132, the second conductor layer 133, the pixel electrode 134, and the first insulating layer 12, and then etching the second insulating layer 14 to form the through hole 140 corresponding to the applied electrodes 114 by a mask, and finally a common electrode 15 is deposited on the second insulating layer 14 and in the through hole 140.

The manufacturing method of the display panel 100 provided by the embodiment of the present application adopts four masks, specifically, one mask forms the first metal layer 11, one mask forms the openings 120 in the first insulating layer 12, and one mask forms the oxide layer 13 (including the channel layer 131 and the pixel electrode 134), one mask forms through hole 140 in the first insulating layer 12 and the second insulating layer 14. Therefore, the mask for separately manufacturing the gate electrode 111 and the pixel electrode 134 is saved, and the deposition process for separately manufacturing the pixel electrode 134 is also saved, thereby reducing the cost and improving the productivity.

The descriptions of the above embodiments are only used to help understand the technical solutions of the present application and their core ideas. Those of ordinary skill in the art should understand that they can still make modifications to the technical solutions described in the foregoing embodiments, or perform equivalent replacements to some of the technical features. However, these modifications or substitutions do not make the essence of the corresponding technical solutions deviate from a scope of the technical solutions of the embodiments of the present application.

What is claimed is:

1. A display panel, comprising:
a substrate;
a first metal layer positioned on the substrate, wherein the first metal layer comprises a gate electrode, a source electrode, a drain electrode, and an applied electrode disposed in a same layer;
a first insulating layer covering the first metal layer, wherein the first insulating layer comprises openings exposing the source electrode and the drain electrode;
an oxide layer positioned on the first insulating layer and in the openings;
a second insulating layer covering the oxide layer and the first insulating layer, wherein a through hole exposing the applied electrode is formed in the first insulating layer and the second insulating layer, the through hole comprises a first through hole formed in the first insulating layer and a second through hole formed in the second insulating layer, and orthographic projections of the first through hole and the second through hole on the substrate coincide; and a common electrode positioned on the second insulating layer and in the through hole, wherein the common electrode is connected to the applied electrode;

wherein the oxide layer comprises a channel layer, a first conductor layer, a second conductor layer, and a pixel electrode, wherein the channel layer is positioned on the gate electrode, wherein the first conductor layer is connected to the source electrode and the channel layer, wherein the second conductor layer is connected to the drain electrode and the channel layer, and wherein the pixel electrode is connected to the drain electrode.

2. The display panel according to claim 1, wherein an orthographic projection of the pixel electrode on the substrate is not overlapped with an orthographic projection of the applied electrode on the substrate.

3. The display panel according to claim 2, wherein the applied electrode is positioned outside the source electrode and the drain electrode.

4. The display panel according to claim 1, wherein the gate electrode is positioned between the source electrode and the drain electrode.

5. The display panel according to claim 1, wherein a material of the oxide layer comprises indium gallium zinc oxide.

6. The display panel according to claim 5, wherein oxygen vacancy rates of the first conductor layer, the second conductor layer, and the pixel electrode are greater than an oxygen vacancy rate of the channel layer.

7. The display panel according to claim 1, wherein the gate electrode, the source electrode, and the drain electrode are manufactured by using a photomask.

8. The display panel according to claim 1, wherein the oxide layer is manufactured by using a mask.

\* \* \* \* \*